United States Patent
Kim

(10) Patent No.: US 7,218,521 B2
(45) Date of Patent: May 15, 2007

(54) DEVICE HAVING IMPROVED HEAT DISSIPATION

(75) Inventor: Ki-Jung Kim, Cheonan-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 264 days.

(21) Appl. No.: 10/992,352

(22) Filed: Nov. 19, 2004

(65) Prior Publication Data

US 2005/0117304 A1   Jun. 2, 2005

(30) Foreign Application Priority Data

Nov. 28, 2003 (KR) .................. 10-2003-0085773

(51) Int. Cl.
  *H05K 7/20* (2006.01)
  *G09G 3/28* (2006.01)

(52) U.S. Cl. .................. 361/704; 361/719; 345/60; 345/905

(58) Field of Classification Search .................. None
See application file for complete search history.

(56) References Cited

U.S. PATENT DOCUMENTS

| | | |
|---|---|---|
| 5,541,618 A | 7/1996 | Shinoda |
| 5,661,500 A | 8/1997 | Shinoda et al. |
| 5,663,741 A | 9/1997 | Kanazawa |
| 5,674,553 A | 10/1997 | Sinoda et al. |
| 5,724,054 A | 3/1998 | Shinoda |
| 5,786,794 A | 7/1998 | Kishi et al. |
| 5,952,782 A | 9/1999 | Nanto |

(Continued)

FOREIGN PATENT DOCUMENTS

JP   02-148645   6/1990

(Continued)

OTHER PUBLICATIONS

"*Final Draft International Standard*", Project No. 47C/61988-1/Ed. 1; Plasma Display Panels—Part 1: Terminology and letter symbols, published by International Electrotechnical Commission, IEC. in 2003, and Appendix A—Description of Technology, Annex B—Relationship Between Voltage Terms And Discharge Characteristics; Annex C—Gaps and Annex D—Manufacturing.

(Continued)

*Primary Examiner*—Boris Chervinsky
(74) *Attorney, Agent, or Firm*—Robert E. Bushnell, Esq.

(57) ABSTRACT

A device having an improved heat dissipation includes: a panel assembly, a chassis base to support the panel assembly, a circuit substrate coupled to the chassis base, a flexible printed cable, respective ends of which are connected to electrode terminals of the panel assembly and a connector of the circuit substrate, the flexible printed cable transmitting electrical signals therebetween, and a heat radiator to dissipate heat generated by an IC and mounted on the chassis base on which the IC of the flexible printed cable is attached. The device can rapidly dissipate heat generated by an IC during operation since a heat radiator is disposed on one end of the chassis base corresponding to the IC of the flexible printed cable. Accordingly, an operating temperature of the IC can be maintained at an appropriate level, thereby improving the reliability of the IC.

8 Claims, 4 Drawing Sheets

U.S. PATENT DOCUMENTS

| | | | |
|---|---|---|---|
| RE37,444 E | 11/2001 | Kanazawa | |
| 6,366,459 B1 * | 4/2002 | Katagiri | 361/686 |
| 6,407,508 B1 * | 6/2002 | Kawada et al. | 315/169.3 |
| 6,411,353 B1 * | 6/2002 | Yarita et al. | 349/59 |
| 6,477,039 B2 * | 11/2002 | Tajima | 361/681 |
| 6,522,543 B2 * | 2/2003 | Kurihara et al. | 361/704 |
| 6,630,916 B1 | 10/2003 | Shinoda | |
| 6,707,436 B2 | 3/2004 | Setoguchi et al. | |
| 6,774,872 B1 * | 8/2004 | Kawada et al. | 345/60 |
| 2003/0058230 A1 * | 3/2003 | Ide | 345/204 |

FOREIGN PATENT DOCUMENTS

| | | | |
|---|---|---|---|
| JP | 10240138 A * | 9/1998 | |
| JP | 2845183 | 10/1998 | |
| JP | 10-308484 | 11/1998 | |
| JP | 2917279 | 4/1999 | |
| JP | 2001-013883 | 1/2001 | |
| JP | 2001-043804 | 2/2001 | |
| JP | 2001-325888 | 11/2001 | |
| JP | 2001-352022 | 12/2001 | |
| JP | 2002124607 A * | 4/2002 | |
| JP | 2003-108017 | 4/2003 | |
| JP | 2004126151 A * | 4/2004 | |

OTHER PUBLICATIONS

Japanese Office Action for corresponding Korean Patent Application No. 2003-85773, issued on Sep. 19, 2006.

* cited by examiner

DEVICE HAVING IMPROVED HEAT DISSIPATION

CLAIM OF PRIORITY

This application makes reference to, incorporates the same herein, and claims all benefits accruing under 35 U.S.C. §119 from an application for PLASMA DISPLAY PANEL ASSEMBLY HAVING THE IMPROVED PROTECTION AGAINST HEAT earlier filed in the Korean Intellectual Property Office on 28 Nov. 2003 and there duly assigned Serial No. 2003-85773.

BACKGROUND OF THE INVENTION

1. Field of the Invention

The present invention relates to a device, such as a Plasma Display Panel (PDP) assembly, and more particularly, to a device having improved heat dissipation of heat generated by an Integrated Circuit (IC) chip.

2. Description of the Related Art

A PDP assembly is a flat display device displaying images using light emitted from a gas filled discharge space in response to ultraviolet rays generated by applying a predetermined voltage to electrodes arranged on substrates facing each other.

The PDP assembly is fabricated by assembling separately formed front and rear panels, arranging a chassis base on a back side of the panel assembly, arranging a circuit substrate on a back side of the chassis base, and then arranging these elements in a case.

A PDP assembly comprises a front panel, a rear panel forming a panel assembly coupling with the front panel, a chassis base coupled by an adhesive member to a back side of the panel assembly, a cover plate disposed on upper and lower parts of the chassis base, and a flexible printed cable interposed between the chassis base and the cover plate.

Heat generated by the panel assembly during operation is dissipated to the outside through the chassis base via the adhesive member that acts simultaneously as an adhesive and a heat transfer medium.

Both the panel assembly and also an Integrated Circuit (IC) chip connected to the flexible printed cable generate heat. The heat generated by the IC is dissipated to the outside through the chassis base and the cover plate.

However, the heat generated by the IC disposed within a space is not freely dissipated since the space in which the flexible printed cable is disposed is surrounded by the chassis base and the cover plate. When the heat dissipation efficiency is lowered, heat can be accumulated in a greater amount in the IC than at an appropriate level, which may lead to a malfunction of the IC.

SUMMARY OF THE INVENTION

The present invention provides a device having a heat radiator to efficiently dissipate heat generated by an IC connected to a flexible printed cable to the outside from a space in which the IC is disposed.

According to an aspect of the present invention, a device is provided including: a panel assembly; a chassis base adapted to support the panel assembly; a circuit substrate coupled to the chassis base; a flexible printed cable having respective ends connected to electrode terminals of the panel assembly and to a connector of the circuit substrate, the flexible printed cable adapted to transmit electrical signals therebetween; and a heat radiator adapted to dissipate heat generated by an IC of the flexible printed cable and mounted on the chassis base on which the IC of the flexible printed cable is attached.

The heat radiator is preferably arranged on an opposite side to a surface of the chassis base on which the IC is attached.

The heat radiator preferably includes a unitary body with the chassis base.

The heat radiator is preferably arranged on one of the upper and lower portions of the chassis base.

The heat radiator preferably includes a heat sink.

The heat radiator preferably includes a heat radiation pad.

The device preferably further includes a cover plate adapted to protect an external portion of the flexible printed cable and the IC arranged between the chassis base and the cover plate.

The heat radiator is preferably mounted on an opposite surface of the chassis base on which the IC is attached in a space formed by the panel assembly, the cover plate, and the chassis base.

The device preferably further includes a thermal grease arranged between the chassis base and the IC, and a thermal pad arranged between the IC and the cover plate.

The heat radiator is preferably attached to a section of the chassis base corresponding to where the IC is attached.

The heat radiator is preferably attached along a lengthwise direction of the chassis base.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Figure 1:
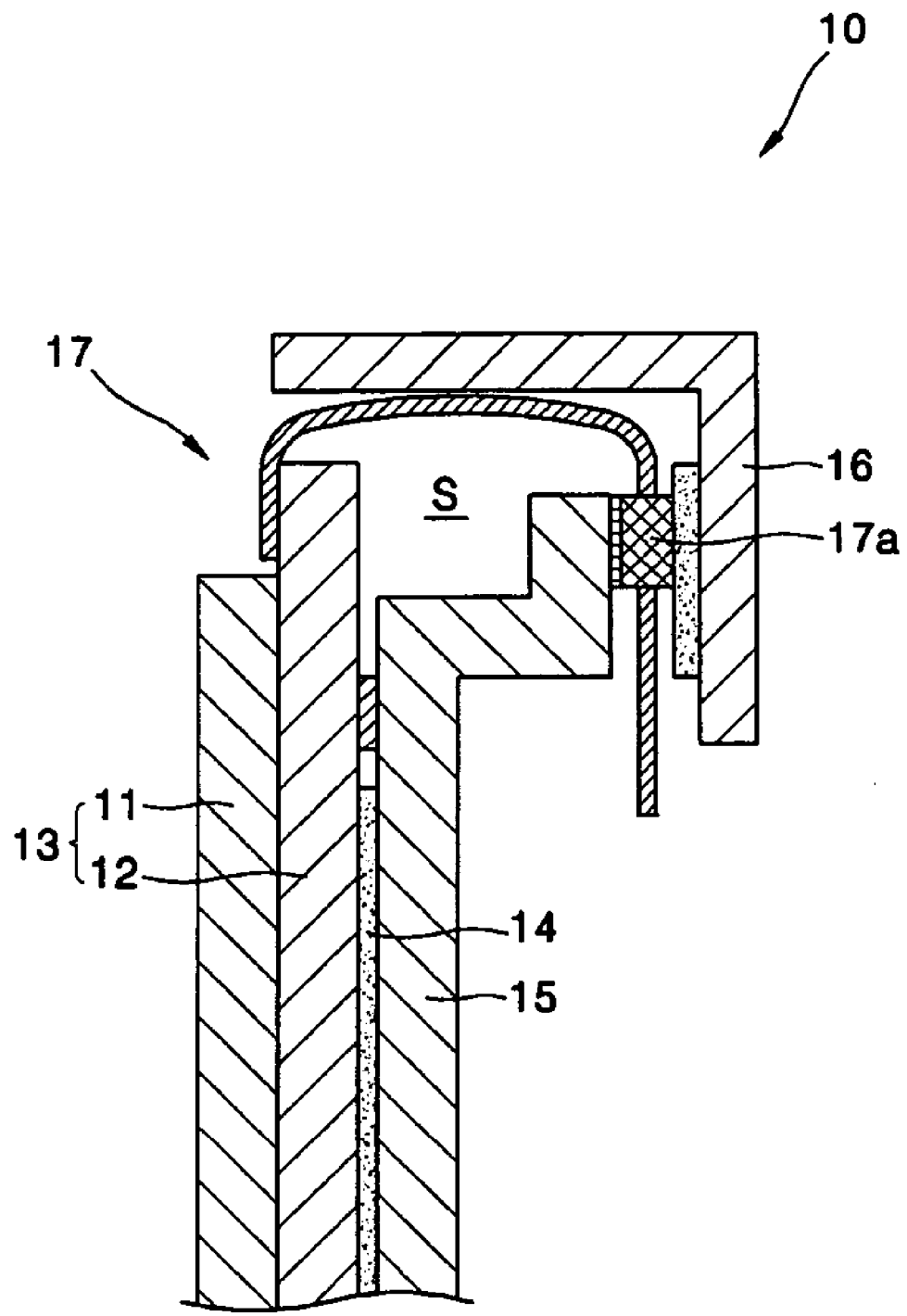
FIG. 1 is a cross-sectional view of a PDP assembly.

FIG. 1 is a cross-sectional view of a PDP assembly. Referring to FIG. 1, a PDP assembly 10 comprises a front panel 11, a rear panel 12 forming a panel assembly 13 coupling with the front panel 11, a chassis base 15 coupled by an adhesive member 14 to a back side of the panel assembly 13, a cover plate 16 disposed on upper and lower parts of the chassis base 15, and a flexible printed cable 17 interposed between the chassis base 15 and the cover plate 16.

Heat generated by the panel assembly 13 during operation is dissipated to the outside through the chassis base 15 via the adhesive member 14 that acts simultaneously as an adhesive and a heat transfer medium.

Both the panel assembly 13 and also an IC 17a connected to the flexible printed cable 17 generate heat. The heat generated by the IC 17a is dissipated to the outside through the chassis base 15 and the cover plate 16.

However, the heat generated by the IC 17*a* disposed within a space S is not freely dissipated since the space S in which the flexible printed cable 17 is disposed is surrounded by the chassis base 15 and the cover plate 16. When the dissipation efficiency of heat is lowered, heat can be accumulated in a greater amount in the IC 17*a* than at an appropriate level, which may lead to a malfunction of the IC 17*a*.

The present invention will now be described more fully with reference to the accompanying drawings in which exemplary embodiments of the invention are shown.

Figure 2:
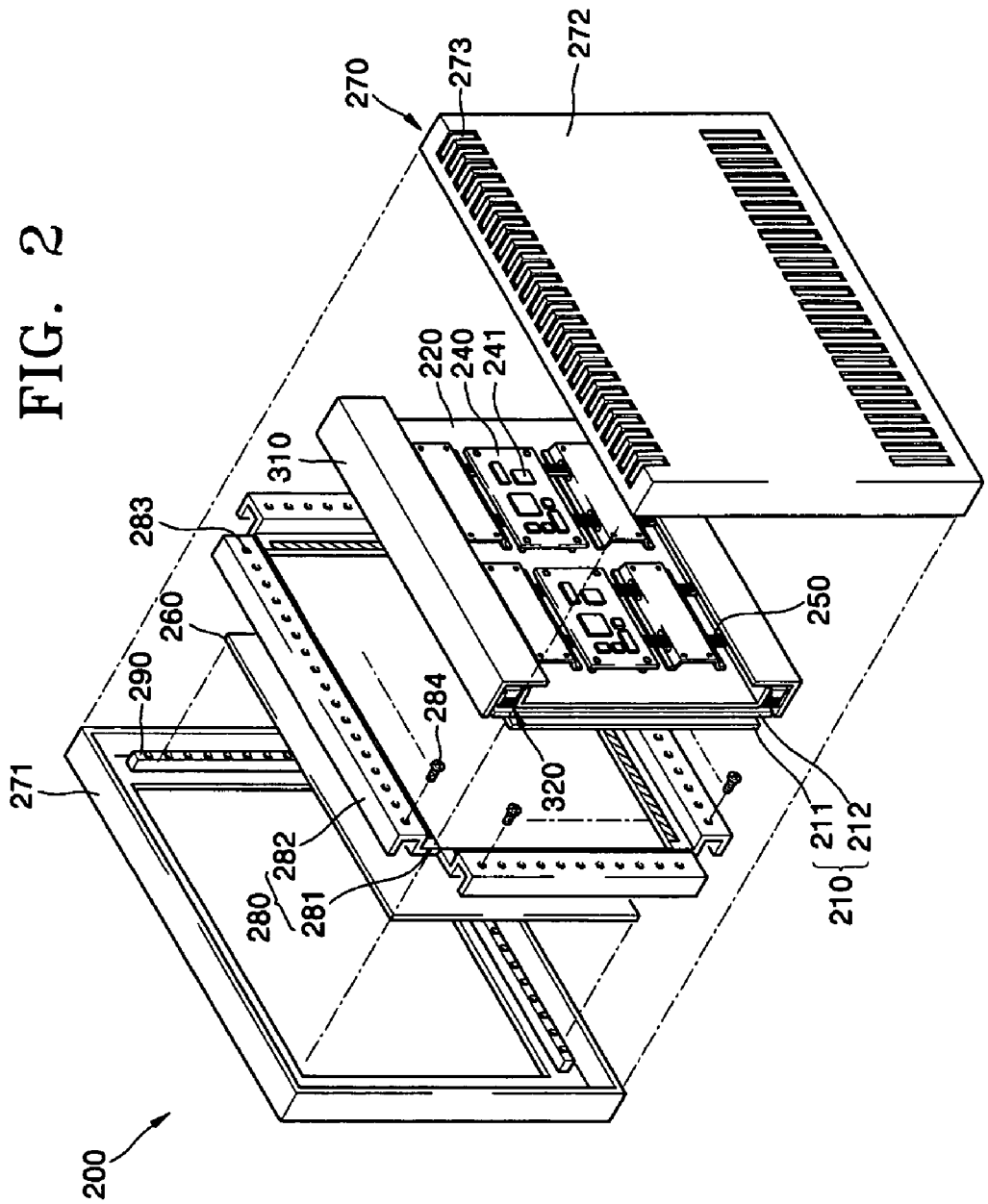
FIG. 2 is an exploded perspective view of a PDP assembly according to an embodiment of the present invention.

FIG. 2 is an exploded perspective view of a PDP assembly according to an embodiment of the present invention. Referring to FIG. 2, a PDP assembly 200 includes a panel assembly 210 including a front panel 211 coupled to a rear panel 212.

The front panel 211 comprises X and Y electrodes, a dielectric layer that covers the X and Y electrodes, and a protective film layer coated on a surface of the dielectric layer. The rear panel 212 faces the front panel 211 and comprises address electrodes, a dielectric layer that covers the address electrodes, barrier ribs that define discharge spaces, and red, green, and blue fluorescent layers coated on inner walls of the barrier ribs.

A chassis base 220 is disposed on a back side of the rear panel 212. The chassis base 220 is coupled to the panel assembly 210 by an adhesive member 230 (in FIG. 3). The adhesive member 230 comprises a double-sided tape 231 and a heat radiation sheet 232 acting as a heat transfer medium to dissipate heat generated by the panel assembly 210 via the chassis base 220.

A circuit substrate 240 is disposed on a back side of the chassis base 220. A plurality of electronic parts are mounted on the circuit substrate 240. The panel assembly 210 and the circuit substrate 240 are connected by flexible printed cables 250. Both ends of the flexible printed cables 250 are connected to a terminal of each of the electrodes of the panel assembly 210 and to the circuit substrate 240 to transmit electrical signals therebetween.

A filter assembly 260 is disposed in front of the front panel 211. The filter assembly 260 shields electromagnetic waves generated by the panel assembly 210, infrared rays, neon light, or reflection of external light.

The filter assembly 260 includes a reflection prevention film attached to the transparent substrate to prevent a reduction in visibility by the reflection of light, an electromagnetic wave shielding layer to effectively shield electromagnetic waves generated by the panel assembly 210 during operation, and a selective wave absorption film to shield unnecessary emissions of near infrared rays by a plasma of an inert gas used for emitting neon light and for displaying images.

The panel assembly 210, the chassis base 220, and the filter assembly 260 are arranged in a case 270. The case 270 includes a front cabinet 271 disposed in front of the filter assembly 260 and a back cover 272 disposed at the rear of the chassis base 220. A plurality of vent holes 273 are formed on upper and lower parts of the back cover 272

A filter holder 280 is mounted on a back side of the filter assembly 260. The filter holder 280 includes a press unit 281 that presses the filter assembly 260 with respect to the front cabinet 271 and a fixing unit 282 bent on a rear of the pressing unit 281. The fixing unit 282 includes a plurality of coupling holes 283.

A filter mounting unit 290 is formed on a back side of the front cabinet 271. The filter mounting unit 290 is disposed facing the fixing unit 282 and affixes the filter assembly 260 to the front cabinet 271 by screws 284.

According to the present invention, at least one heat radiator 320 is mounted on upper and lower parts of the chassis base 220 to rapidly dissipate heat generated by the IC of the is flexible printed cable 250 during operation.

Figure 3:
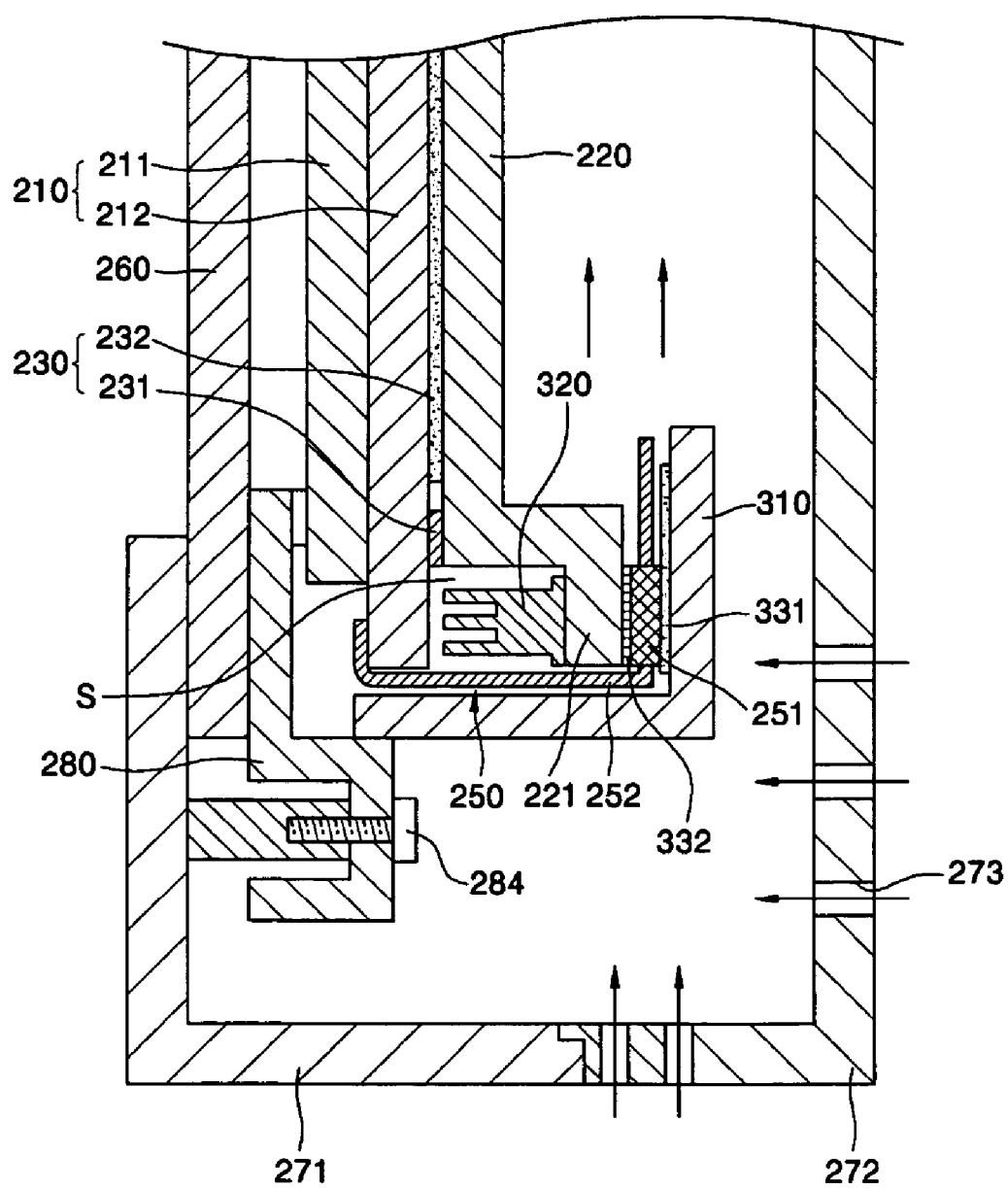
FIG. 3 is a cross-sectional view of a portion of a PDP assembly in which a heat radiator is mounted according to a first embodiment of the present invention.

FIG. 3 is a cross-sectional view of a portion of a PDP assembly in which a heat radiator is mounted according to a first embodiment of the present invention. Like reference numerals in the previous drawing denote like elements.

Referring to FIG. 3, the filter assembly 260, the panel assembly 210, and the chassis base 220 are arranged sequentially in the case 270. That is, the front cabinet 271 is disposed in front of the filter assembly 260, the back cover 272 is disposed at the rear of the chassis base 220, and the filter assembly 260, the panel assembly 210, and the chassis base 220 are disposed in a space formed by joining the front cabinet 271 to the back cover 272.

The chassis base 220 is attached to a back side of the rear panel 212 by the double-sided tape 231 and the heat radiation sheet 232. The chassis base 220 not only supports the panel assembly 210, but also dissipates heat generated by the panel assembly 210 during operation and transmitted through the radiation sheet 232. Upper and lower parts 221 of the chassis base 220 are bent in an "L" shape at a predetermined angle to reinforce the chassis base 220.

The flexible printed cables 250 for transmitting electrical signals between terminals of the panel assembly 210 and the circuit substrates 240 are disposed at the upper and lower parts 221 of the chassis base 220.

Each of the flexible printed cables 250 includes an IC 251 and a film 252 having flexibility and buried wiring connected to the IC 251. Respective ends of the film 252 are connected to electrode terminals of the panel assembly 210 and to a connector of the circuit substrate 240.

The flexible printed cables 250 are disposed outside of the upper and lower parts 221 of the chassis base 220. A cover plate 310 for preventing damage of the IC 251 is mounted outside of the flexible printed cable 250.

The cover plate 310 is a frame bent approximately in an "L" shape and has a structure connected to the chassis base 220 accommodating the flexible printed cable 250. At least one cover plate 310 is mounted in a horizontal direction of the chassis base 220 or in a vertical direction of the chassis base 220, but any shape that can accommodate the flexible printed cables 250 can be used. Also, the cover plate 310 can be fixed by any method that can protect the flexible printed cables 250 and fix the IC 251 by magnetic force or a double-sided tape. However, the present invention is not limited thereto.

A thermal grease 332 is interposed to reduce thermal resistance between the IC 251 and the chassis base 220. Also, a thermal pad 331 is interposed between the IC 251 and the cover plate 310.

A heat radiator such as a heat sink 320 is mounted in a space S formed by joining the panel assembly 210, the chassis base 220, and the cover plate 310. The heat sink 320 is attached to an inner surface of one end of the chassis base 220, and at least one heat sink 320 is disposed along the space S.

A plurality of heat sinks 320 can be respectively disposed on opposite sides of the chassis base 220 on which the IC 251 is attached or the heat sink 320 can be a unitary body structure with the chassis base 220 along the length direction of the chassis base 220.

The PDP assembly 200 having above structure dissipates heat generated during the operation of the panel assembly 210 through the chassis base 220 via the heat radiation sheet 232. Also, heat generated by the IC 251 is primarily dissipated through the chassis base 220 and can be simultaneously dissipated through the heat sink 320.

The heat dissipated as noted above is cooled by air flowing through a plurality of vent holes 273 formed on the back cover 272, and exhausted to the outside from lower parts to upper parts of the case 270 by convection.

In effect, according to an experiment of the present invention, when a heat sink 320 is attached to the end part of the chassis base 220 corresponding to the IC 251, it is observed that the temperature of the IC 251 has a maximum of 85° C. which is a temperature required for operating the IC 251 in stable conditions.

Figure 4:
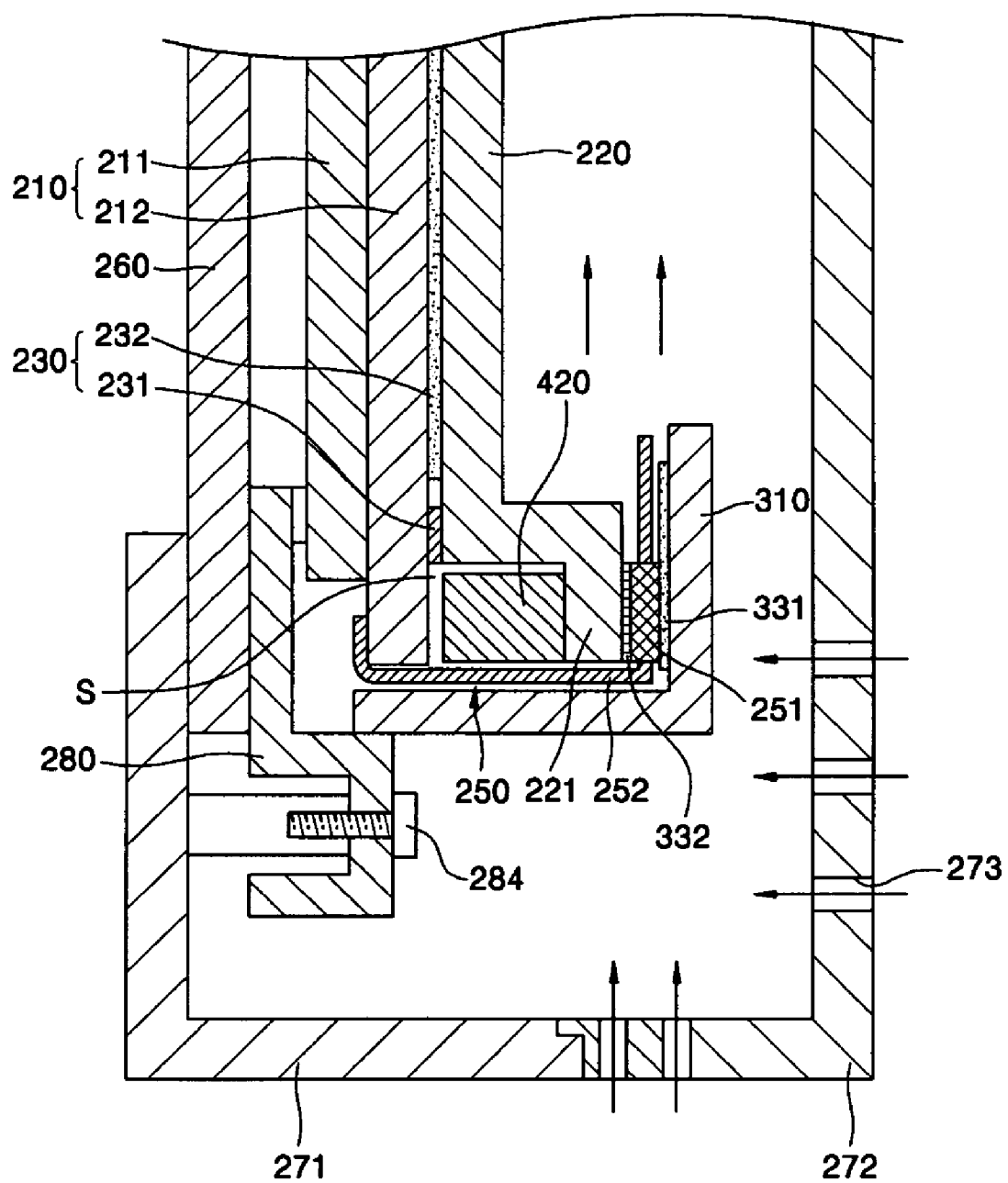
FIG. 4 is a cross-sectional view of a portion of a PDP assembly in which a heat radiator is mounted according to a second embodiment of the present invention.

FIG. 4 is a cross-sectional view illustrating a section of a PDP assembly in which a heat radiator is mounted according to a second embodiment of the present invention.

Referring to FIG. 4, a heat radiator, such as a heat radiation pad 420, is disposed in a space S formed by joining the panel assembly 210, the chassis base 220, and the cover plate 310.

That is, the heat radiation pad 420 is attached to an inner surface of the end part 221 of the chassis base 220 on which the IC 251 is mounted. The heat radiation pad 420 is preferably formed of a material such as a silicon rubber that can rapidly absorb the heat generated by the IC 251.

The heat generated by the IC 251 is dissipated through the chassis base 220 and can also be dissipated through the heat radiation pad 420 since the heat radiation pad 420 is mounted on an opposite side of one end 221 of the chassis base 220 on which the IC 251 is mounted.

As described above, the device according to the present invention can rapidly dissipate heat generated by an IC during operation since a heat radiator is disposed on one end of the chassis base corresponding to the IC of the flexible printed cable. Accordingly, an operating temperature of the IC can be maintained in an appropriate level, thereby improving the reliability of the IC.

While the present invention has been particularly shown and described with reference to exemplary embodiments thereof, it will be understood by those of ordinary skill in the art that various modifications in form and details may be made therein without departing from the spirit and scope of the present invention as recited in the following claims.

What is claimed is:

1. A device comprising:
   a panel assembly;
   a chassis base adapted to support the panel assembly;
   a circuit substrate coupled to the chassis base;
   a flexible printed cable having respective ends connected to electrode terminals of the panel assembly and to a connector of the circuit substrate, the flexible printed cable adapted to transmit electrical signals therebetween;
   a heat radiator adapted to dissipate heat generated by an IC of the flexible printed cable, the IC being attached to one surface of the chassis base, and the heat radiator beina attached to the chassis base on which the IC is attached; and
   a cover plate arranged outside of the flexible printed cable to protect the IC of the fexible printed cable, the IC being arranged between the chassis base and the cover plate;
   wherein the heat radiator is attached to an opposite surface to the one surface of the chassis base on which the IC is attached, the heat radiator being arranged in a space defined by the panel assembly, the cover plate, and the chassis base.

2. The device of claim 1, wherein the heat radiator comprises a unitary body with the chassis base.

3. The device of claim 1, wherein the heat radiator is arranged on one of the upper and lower portions of the chassis base.

4. The device of claim 1, wherein the heat radiator comprises a heat sink.

5. The device of claim 1, wherein the heat radiator comprises a heat radiation pad.

6. The device of claim 1, further comprising a thermal grease arranged between the chassis base and the IC, and a thermal pad arranged between the IC and the cover plate.

7. The device of claim 1, wherein the heat radiator is attached to a section of the chassis base corresponding to where the IC is attached.

8. The device of claim 1, wherein the heat radiator is attached along a lengthwise direction of the chassis base.

* * * * *